United States Patent
Bafna et al.

(10) Patent No.: US 10,897,267 B1
(45) Date of Patent: Jan. 19, 2021

(54) MULTI-OUTPUT DIGITAL TO ANALOG CONVERTER

(71) Applicant: TEXAS INSTRUMENTS INCORPORATED, Dallas, TX (US)

(72) Inventors: Naman Bafna, Balaghat (IN); Muthusubramanian Venkateswaran, Bangalore (IN); Rohit Narula, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/731,280

(22) Filed: Dec. 31, 2019

(51) Int. Cl.
*H03M 1/66* (2006.01)
*H03M 1/68* (2006.01)
*H03M 1/76* (2006.01)
*H03M 1/74* (2006.01)

(52) U.S. Cl.
CPC ........... *H03M 1/682* (2013.01); *H03M 1/662* (2013.01); *H03M 1/747* (2013.01); *H03M 1/765* (2013.01)

(58) Field of Classification Search
CPC ...... H03M 1/682; H03M 1/662; H03M 1/765; H03M 1/747; H03M 1/66
USPC .................................................. 341/144, 154
See application file for complete search history.

(56) References Cited

U.S. PATENT DOCUMENTS

| | | | | |
|---|---|---|---|---|
| 4,749,984 A * | 6/1988 | Prost | ..................... | H03M 1/16 324/99 D |
| 5,324,995 A * | 6/1994 | Yee | ..................... | G11C 27/024 327/76 |
| 5,600,322 A * | 2/1997 | Garavan | ................ | H03M 1/144 341/120 |
| 5,969,657 A * | 10/1999 | Dempsey | .............. | H03M 1/682 341/145 |
| 6,144,331 A * | 11/2000 | Jiang | .................... | H03M 1/0682 341/150 |
| 6,707,404 B1 * | 3/2004 | Yilmaz | ............... | H03M 1/1061 341/120 |
| 6,781,536 B1 * | 8/2004 | Martins | ................. | H03M 1/682 341/144 |
| 7,124,221 B1 * | 10/2006 | Zerbe | ................ | H04L 25/03006 710/106 |
| 7,456,385 B2 * | 11/2008 | Engstrand | ................ | G01D 5/28 123/478 |
| 8,395,538 B2 * | 3/2013 | Das | ......................... | H03M 1/68 341/163 |
| 8,867,268 B2 * | 10/2014 | Yang | ...................... | G11C 16/10 365/185.02 |

(Continued)

*Primary Examiner* — Jean B Jeanglaude
(74) *Attorney, Agent, or Firm* — Mark Allen Valetti; Charles A. Brill; Frank D. Cimino (57) ABSTRACT

A circuit includes a first voltage divider having a set of most significant bit (MSB) outputs each representative of a value of a MSB portion of a digital code. The circuit also includes a second voltage divider having a first upper voltage input configured to couple to a first one of a first pair of outputs of the set of MSB outputs, and a first lower voltage input configured to couple to a second one of the first pair of outputs of the set of MSB outputs. The circuit also includes a third voltage divider having a second upper voltage input configured to couple to a first one of a second pair of outputs of the set of MSB outputs, and a second lower voltage input configured to couple to a second one of the second pair of outputs of the set of MSB outputs.

20 Claims, 6 Drawing Sheets

(56) References Cited

U.S. PATENT DOCUMENTS

| | | | | |
|---|---|---|---|---|
| 8,884,799 B2 * | 11/2014 | Price | ...................... | H03M 1/002 |
| | | | | 341/145 |
| 9,083,380 B2 * | 7/2015 | Price | ...................... | H03M 1/002 |
| 9,641,186 B2 * | 5/2017 | Thomsen | ............. | H03M 1/0609 |
| 9,654,136 B1 * | 5/2017 | Deak | ...................... | H03M 1/687 |
| 10,305,505 B1 * | 5/2019 | Zhang | ..................... | H03M 1/68 |
| 2012/0319886 A1 * | 12/2012 | Das | ......................... | H03M 1/68 |
| | | | | 341/158 |
| 2013/0076546 A1 * | 3/2013 | Wan | ..................... | H03M 1/1033 |
| | | | | 341/120 |
| 2013/0229869 A1 * | 9/2013 | Yang | ...................... | G11C 16/10 |
| | | | | 365/185.03 |
| 2014/0132435 A1 * | 5/2014 | Dempsey | ............. | H03M 1/0872 |
| | | | | 341/154 |
| 2014/0266835 A1 * | 9/2014 | Price | ..................... | H03M 1/808 |
| | | | | 341/145 |
| 2014/0347202 A1 * | 11/2014 | Price | ....................... | H03M 1/78 |
| | | | | 341/145 |

* cited by examiner

MULTI-OUTPUT DIGITAL TO ANALOG CONVERTER

BACKGROUND

A digital to analog converter (DAC) converts a digital code into an analog voltage. Different values encoded by the digital code produce different analog voltage values. Some DACs include a resistor string to create a voltage divider and select voltage outputs from terminals between the resistors of the resistor string.

SUMMARY

In accordance with at least one example of the disclosure, a circuit includes a first voltage divider having a set of most significant bit (MSB) outputs each representative of a value of a MSB portion of a digital code. The circuit also includes a second voltage divider having a first upper voltage input configured to couple to a first one of a first pair of outputs of the set of MSB outputs, and a first lower voltage input configured to couple to a second one of the first pair of outputs of the set of MSB outputs. The circuit also includes a third voltage divider having a second upper voltage input configured to couple to a first one of a second pair of outputs of the set of MSB outputs, and a second lower voltage input configured to couple to a second one of the second pair of outputs of the set of MSB outputs.

In accordance with another example of the disclosure, a circuit includes a first voltage divider configured to generate a set of most significant bit (MSB) voltages each corresponding to a value of a MSB portion of a digital code, a second voltage divider configured to divide a first pair of MSB voltages from the set of MSB voltages into a first set of least significant bit (LSB) voltages, and a third voltage divider configured to divide a second pair of MSB voltages from the set of MSB voltages into a second set of LSB voltages.

In accordance with yet another example of the disclosure, a system includes an upper voltage reference input; a lower voltage reference input; a set of most significant bit (MSB) resistors coupled to the upper voltage reference input and the lower voltage reference input, the set of MSB resistors configured to provide a set of MSB voltage outputs based on the upper voltage reference input and the lower voltage reference input. The system also includes a first pair of switches; a first set of least significant bit (LSB) resistors, the first pair of switches configured to couple a first pair of MSB voltage outputs from the set of MSB voltage outputs to the first set of LSB resistors, the first set of LSB resistors configured to provide a first set of LSB voltages based on the first pair of MSB voltages; a second pair of switches; and a second set of least significant bit (LSB) resistors, the second pair of switches configured to couple a second pair of MSB voltage outputs from the set of MSB voltage outputs to the second set of LSB resistors, the second set of LSB resistors configured to provide a second set of LSB voltages based on the second pair of MSB voltages.

BRIEF DESCRIPTION OF THE DRAWINGS

For a detailed description of various examples, reference will now be made to the accompanying drawings in which.

DETAILED DESCRIPTION

As explained above, some DACs include a resistor string to create a voltage divider and select voltage outputs from nodes between the resistors of the resistor string. The resistors take up a large area of space when implemented on silicon, such as in an integrated circuit. When two different voltage values are desired, placing two independent DACs on the silicon doubles the consumed space. Similarly, when additional values are desired, additional DACs (which occupy more space) are used.

Disclosed herein are various examples of a multi-output DAC having a reduced footprint relative to that occupied by multiple separate DACs with an equivalent number of outputs. A multi-output DAC receives multiple digital codes and outputs multiple analog voltages. A digital code is a value represented by a series of bits. In examples of this disclosure, the digital code is split into a most-significant bit (MSB) portion and a least-significant bit (LSB) portion. The MSB portion includes one or more of the most-significant bits of the series of bits, while the LSB portion includes the remaining least-significant bits of the series of bits. As used herein, D followed by a numeral refers to a digital code (e.g., D1, D2); MSB followed by a numeral refers to the MSB portion of the associated digital code (e.g., MSB1 refers to the MSB portion of D1); and LSB followed by a numeral refers to the LSB portion of the associated digital code (e.g., LSB1 refers to the LSB portion of D1). A multi-output DAC comprises a MSB resistor string coupled to multiple LSB resistor strings. The MSB resistor string produces an intermediate voltage value based on the MSB portion of a digital code that is subsequently refined by the LSB resistor strings based on the LSB portion of the digital code. For example, a MSB resistor string uses a 4 volt (V) reference voltage to create 0 V, 1 V, 2 V, and 3 V outputs. Continuing this example, an LSB resistor string uses the 1 V and 2 V outputs of the MSB resistor string to create 1.25 V, 1.5 V, 1.75 V, and 2 V outputs. A DAC in which two LSB resistor strings are coupled to a MSB resistor string can provide two different voltage outputs, one from each LSB resistor string. Generally, a DAC in which multiple LSB resistor strings are coupled to a MSB resistor string can provide multiple different voltage outputs, one from each of the LSB resistor strings.

The MSB resistor string is shared by the multiple LSB resistor strings and, as a result, fewer resistors are used to create the multi-output DAC than if multiple single-output DACs were used. As a result, the amount of space occupied by the multi-output DAC described herein is smaller than the space occupied by multiple separate DACs producing an equivalent number of outputs. In addition, the multi-output DAC includes control logic to operate the multi-output DAC, but even after accounting for the space occupied by the control logic, the multi-output DAC still provides a net reduction in the space occupied.

Figure 1:
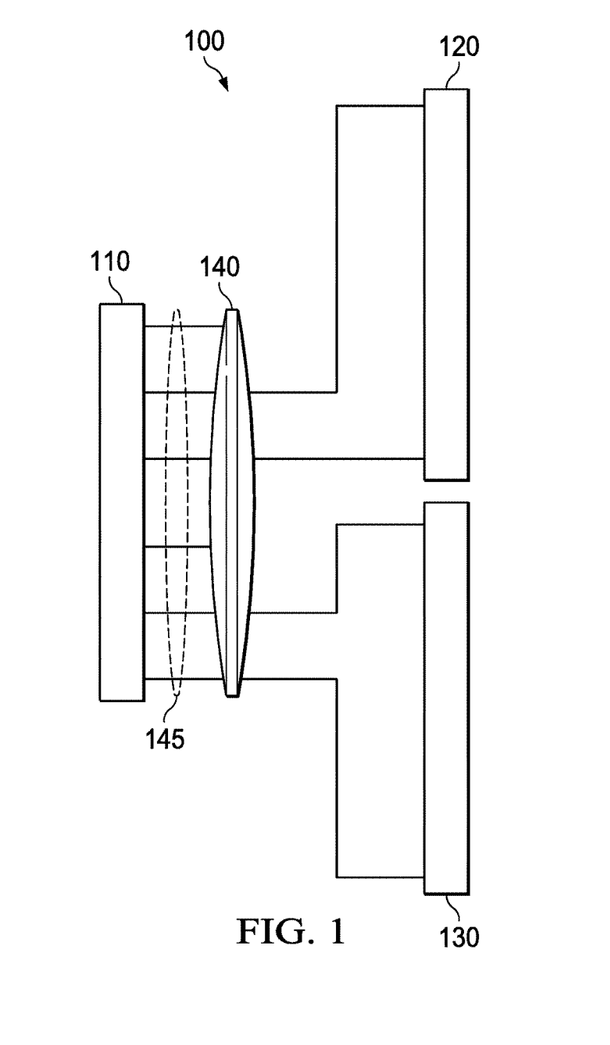
FIG. 1 depicts a block diagram of a circuit that includes a most significant bit (MSB) voltage divider coupled to a first least significant bit (LSB) voltage divider and a second LSB voltage divider in accordance with various examples.

FIG. 1 is a block diagram of a circuit 100 including a MSB voltage divider 110 coupled to a first LSB voltage divider 120 and a second LSB voltage divider 130, in accordance with various examples. The MSB voltage divider 110 provides a set of MSB outputs 145. The LSB voltage dividers 120, 130 couple to the MSB voltage divider 110 via the set of MSB outputs 145. These couplings between the MSB outputs 145 and the LSB voltage dividers 120, 130 are represented by a single numeral 140 to indicate that various combinations of such couplings are possible. For example, the top two MSB outputs 145 couple to the LSB voltage divider 120 and the bottom two MSB outputs 145 couple to the LSB voltage divider 130.

The MSB voltage divider 110 receives two reference voltages. In an example, the reference voltages include a positive reference voltage and ground. In other examples, negative reference voltages are used. In various examples, the reference voltages are both non-ground values, both positive values, both negative values, or some combination of positive, negative, and/or ground values. The MSB voltage divider 110 comprises a resistor string to divide the reference voltages into various voltage values, which are output on the MSB outputs 145. The MSB outputs 145 couple to nodes between resistors of the resistor string.

The LSB voltage dividers 120, 130 couple to the MSB voltage divider 110 via any pair of MSB outputs selected from the set of MSB outputs 145. The LSB voltage dividers 120, 130 use the signals from the MSB outputs 145 as reference voltages. In an example, the LSB voltage dividers 120, 130 comprise resistor strings that divide these reference voltages into other voltage values. As will be described in further detail below, the circuit 100 receives two digital codes as inputs (e.g., D1 and D2), the MSB portion of which controls the selection of MSB outputs 145 and the MSB and LSB portions of which control the selection of the outputs of the LSB voltage dividers 120, 130. The outputs of the LSB voltage dividers 120, 130 are analog outputs that correspond to the digital codes D1 and D2, respectively. By using a single MSB voltage divider 110 to implement a two-output DAC, the overall area of the circuit 100 is reduced.

Figure 2:
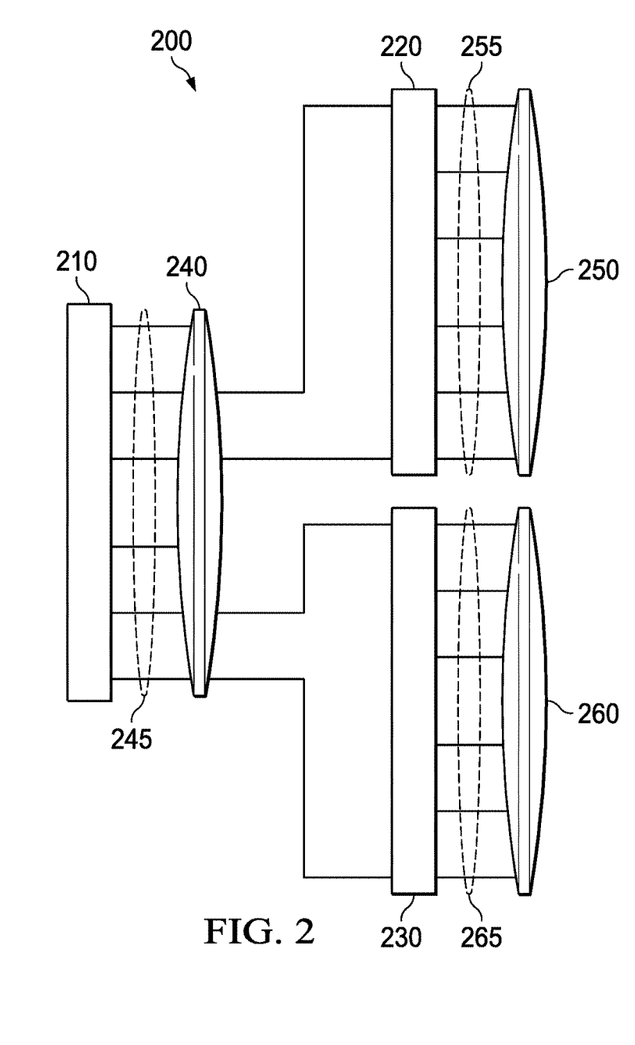
FIG. 2 depicts a block diagram of a circuit that includes a MSB voltage divider coupled to a first LSB voltage divider and a second LSB voltage divider, in accordance with various examples.

FIG. 2 depicts a circuit 200 including a MSB voltage divider 210 coupled to a first LSB voltage divider 220 and a second LSB voltage divider 230, in accordance with various examples. The MSB voltage divider 210 provides a set of MSB outputs 245. The first LSB voltage divider 220 provides a first set of LSB outputs 255, and the second LSB voltage divider 230 provides a second set of LSB outputs 265, in accordance with various examples. The LSB voltage dividers 220, 230 couple to the MSB voltage divider 210 to receive pairs of voltages from the set of MSB outputs 245. Similar to numeral 140 in FIG. 1, in FIG. 2 the numerals 240, 250, and 260 indicate the fact that a variety of couplings are possible between the MSB outputs 245 and the LSB voltage dividers 220, 230, and indicate the fact that a variety of couplings are possible between the LSB outputs 255, 265 and circuitry (not expressly shown) to which the LSB outputs 255, 265 couple. The LSB voltage dividers 220, 230 use voltages received via the MSB outputs 245 as reference voltages and divide them into voltages that are output by the LSB outputs 255, 265. Voltages output by the MSB voltage divider 210 are referred to herein as MSB voltages, which are provided on the MSB outputs 245. Similarly, voltages output by the LSB voltage dividers 220, 230 are referred to as LSB voltages, which are provided on the LSB outputs 255, 265. The LSB voltages are analog outputs that correspond to the digital code inputs (e.g., D1 and D2), which are described further below.

Figure 3:
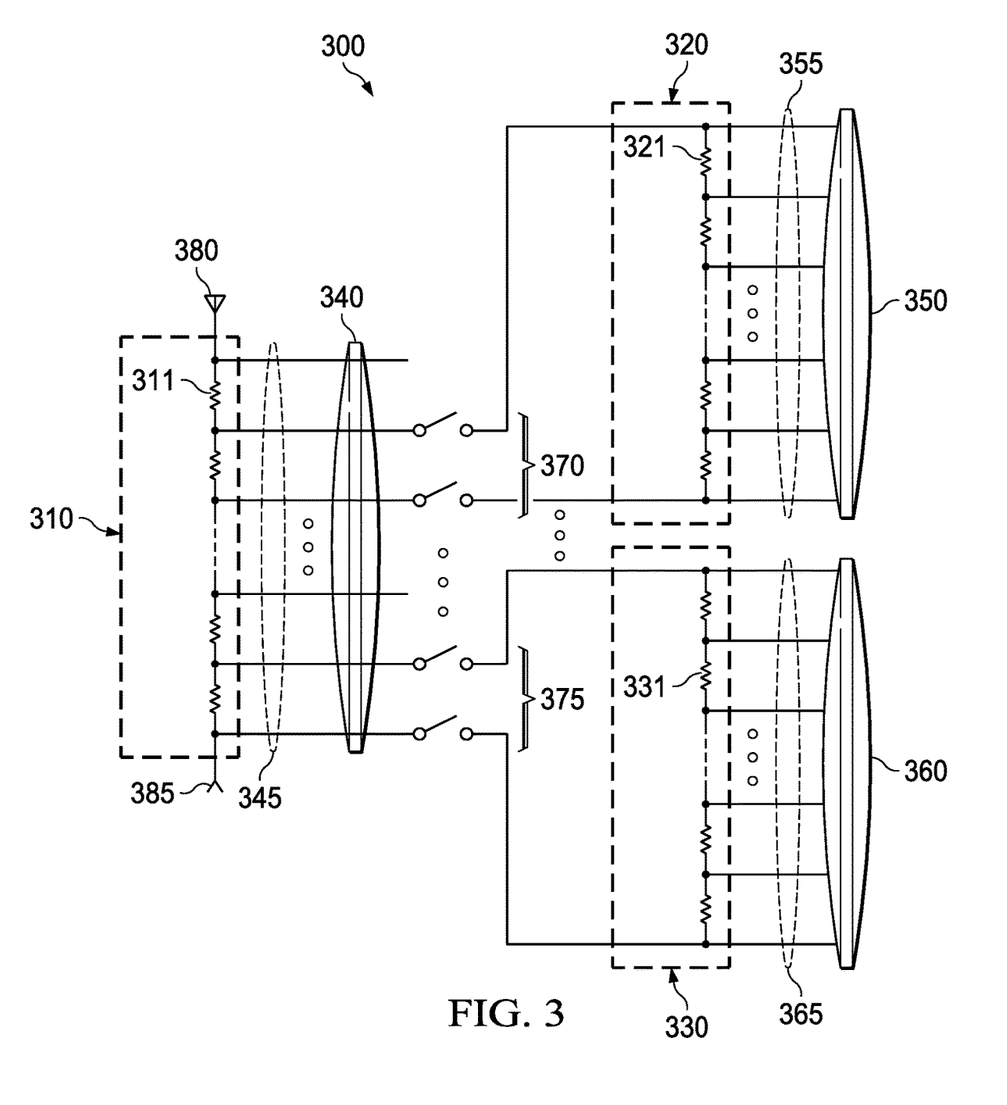
FIG. 3 depicts a schematic diagram of a circuit that includes resistor strings as MSB and LSB voltage dividers in accordance with various examples.

FIG. 3 depicts an illustrative circuit 300 including a MSB voltage divider 310 comprising MSB resistors 311 coupled as shown. The circuit 300 also comprises a first LSB voltage divider 320 comprising LSB resistors 321 coupled as shown, and further comprises a second LSB voltage divider 330 including LSB resistors 331 coupled as shown. Although four resistors are shown in each voltage divider 310, 320, 330, other examples use different numbers of resistors. In addition, the number of resistors used in each voltage divider 310, 320, 330 can differ. The MSB voltage divider 310 couples to reference voltage connections 380, 385, each of which provides a different reference voltage to the MSB voltage divider 310. The MSB voltage divider 310 divides the difference between the reference voltages to produce a set of output voltages on the MSB outputs 345. Thus, the MSB voltages on the MSB outputs 345 range between the reference voltages provided on the reference voltage connections 380, 385. The MSB voltage provided on each MSB output 345 differs from the MSB voltages provided on the remaining MSB outputs 345.

The first LSB voltage divider 320 includes resistors 321 coupled together to form a resistor string. The first LSB voltage divider 320 couples to the MSB voltage divider 310 to receive the MSB voltages on the MSB outputs 345, which are input voltages for the first LSB voltage divider 320. A first pair of switches 370 selects two of the output voltages from the MSB outputs 345. For example, the first pair of switches 370 couples one MSB output 345 to the top of the resistor string of the first LSB voltage divider 320 and another MSB output 345 to the bottom of the resistor string of the first LSB voltage divider 320. The first LSB voltage divider 320 divides the difference between the MSB voltages on the MSB outputs 345 selected by the first pair of switches 370 to produce a set of voltages on LSB outputs 355. The LSB outputs 355 are coupled to nodes between the resistors in the resistor string of the first LSB voltage divider 320 or nodes between the resistor string and the first pair of switches 370 (e.g., at the top and bottom of the resistor string).

The second LSB voltage divider 330 includes resistors 331 coupled together to form a resistor string. The second LSB voltage divider 330 couples to the MSB voltage divider 310 to receive MSB voltages on the MSB outputs 345, which are input voltages for the second LSB voltage divider 330. A second pair of switches 375 selects two of the voltages from the MSB outputs 345. For example, the second pair of switches 375 couples one MSB output 345 to the top of the resistor string of the second LSB voltage divider 330 and another MSB output 345 to the bottom of the resistor string of the second LSB voltage divider 330. The second LSB voltage divider 330 divides the difference between the MSB outputs 345 selected by the second pair of switches 375 to produce a set of voltages on LSB outputs 365. The LSB outputs 365 are coupled to nodes between the resistors in the resistor string of the second LSB voltage divider 330 or nodes between the resistor string and the second pair of switches 375 (e.g., at the top and bottom of the resistor string).

In one example, the resistors in the resistor strings of the MSB voltage divider 310, the first LSB voltage divider 320, and the second LSB voltage divider 330 have the same resistance value. As a result, the DAC implemented by the circuit 300 is a monotonic DAC.

The numeral 340 denotes the variety of combinations of couplings that are possible between MSB output 345 and LSB voltage dividers 320, 330. Similarly, the numerals 350, 360 denote the variety of combinations of couplings possible between the LSB outputs 355, 365 and other circuitry (not expressly shown). As above, LSB voltages on LSB outputs 355, 365 are analog outputs that correspond to the digital code inputs (e.g., D1 and D2), which are described further below.

Figure 4:
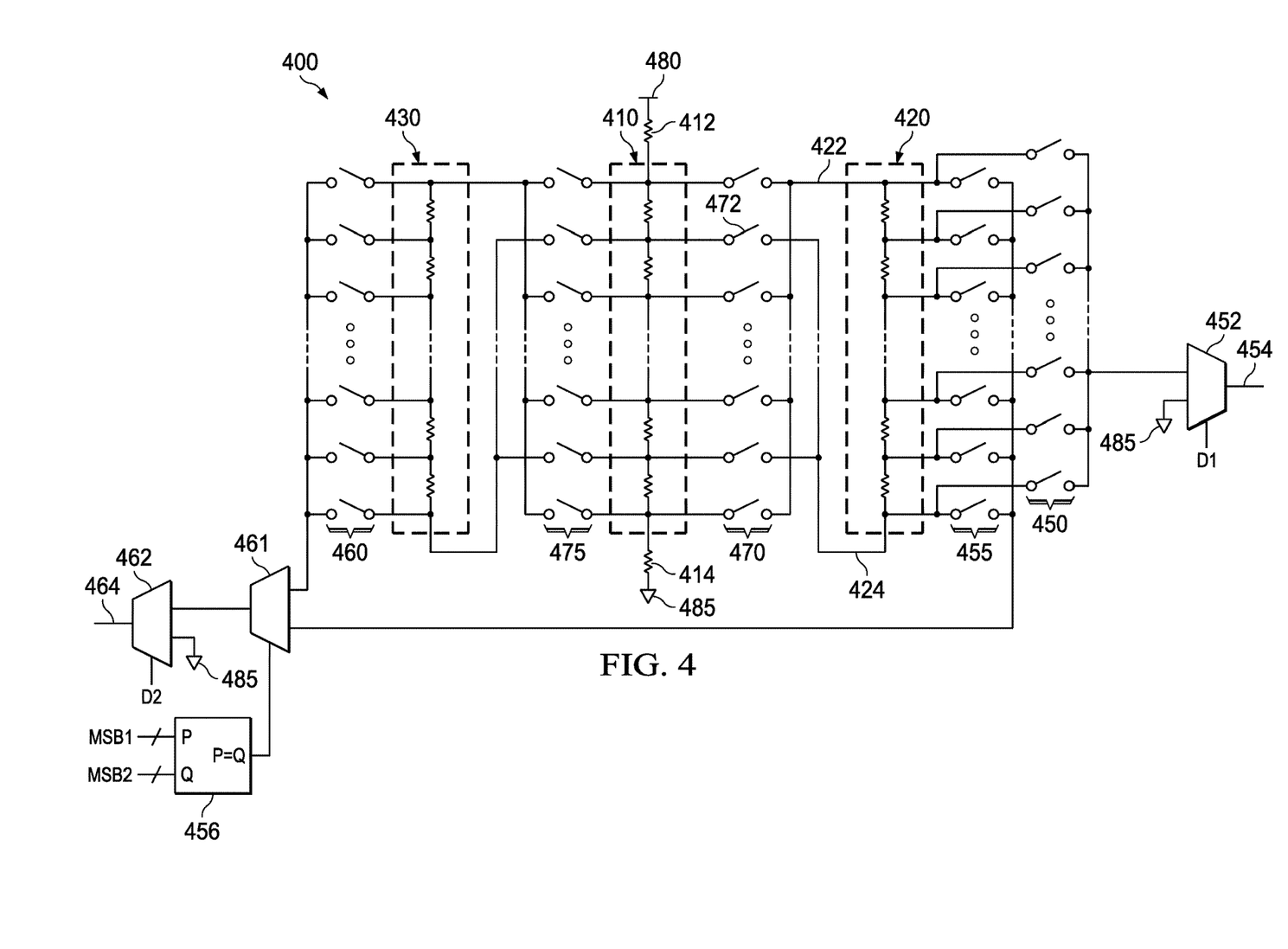
FIG. 4 depicts a schematic diagram of a circuit implementing a DAC that includes a MSB voltage divider, LSB voltage dividers, and multiplexors in accordance with various examples.

FIG. 4 depicts an illustrative circuit implementation of a DAC 400 including a MSB voltage divider 410, two LSB voltage dividers 420, 430, multiplexors 452, 461, 462, and a comparator 456, in accordance with various examples. As above, by using a single MSB voltage divider 410 to implement a two-output DAC 400, the overall area of the DAC 400 is reduced. The voltage dividers 410, 420, 430 are similar to the voltage dividers 310, 320, 330 described above with respect to FIG. 3. In one example, the DAC 400 is configured to couple to a reference voltage terminal 480 and a ground terminal 485. In particular, a resistor string of the MSB voltage divider 410 is configured to couple to the reference voltage terminal 480 and the ground terminal 485. Outputs of the MSB voltage divider 410 are coupled to the first LSB voltage divider 420 via a first set of switches 470 and to the second LSB voltage divider 430 via a second set of switches 475. The output(s) of the first LSB voltage divider 420 are selected via sets of switches 455, 450, while the output of the second LSB voltage divider 430 is selected via a set of switches 460. A multiplexor 452 includes two input nodes, one of which is coupled to an output of the first LSB voltage divider 420 selected by the switches 450 and the other of which is coupled to the ground terminal 485. The multiplexor 452 produces a first DAC output 454 based on the digital code D1. Another multiplexor 461 includes two input nodes, one of which is coupled to an output of the first LSB voltage divider 420 selected by the switches 455 and the other of which is coupled to an output of the second LSB voltage divider 430 selected by the switches 460. The output of multiplexor 461 is governed as described below. Another multiplexor 462 includes two input nodes, one of which is coupled to an output of the multiplexor 461 and the other of which is coupled to the ground terminal 485. The multiplexor 462 produces a second DAC output 464 based on the digital code D2. In an example, the DAC 400 receives the two different digital codes (D1 and D2) that control the various sets of switches 470, 475, 450, 455, 460 and multiplexors 452, 461, 462, and thus the analog voltage values output by the first DAC output 454 and the second DAC output 464. In some cases, a voltage of the first DAC output 454 is different than a voltage of the second DAC output 464.

In an example, the comparator 456 compares the MSB portion (MSB1) of the first digital code D1 with the MSB portion (MSB2) of the second digital code D2. The two multiplexor 461 inputs are coupled to the set of switches 460 and the set of switches 455, while an output of the comparator 456 controls the output of the multiplexor 461. When the comparator 456 indicates MSB1 and MSB2 are equal, the multiplexor 461 selects as its output the LSB output from the first LSB voltage divider 420 as selected by the set of switches 455. When the comparator 456 indicates MSB1 and MSB2 are different, the multiplexor 461 selects as its output the LSB output from the second LSB voltage divider 430 as selected by the set of switches 460.

In various examples, the sets of switches 470, 475, 450, 455, 460 are controlled based on the digital code inputs D1 and D2, which are decoded according to principles described herein. For example, if the sets of switches 470, 475 coupled to the MSB voltage divider 410 are controlled by a 2-bit MSB portion of a digital code, there will be four outputs of the MSB voltage divider 410 provided to the first and second LSB voltage dividers 420, 430. In this example, each set of switches 470, 475 includes four switches (different than as depicted in FIG. 4). The 2-bit MSB portion is provided to, for example, a 2:4 decoder, which converts the 2-bit MSB portion into signals to control the sets of switches 470, 475. Specifically, the decoder selects between the four outputs for the MSB voltage divider 410 by opening or closing each of the four switches of each set of switches 470, 475. In this way, the MSB voltage divider 410 provides reference voltages to the first and second LSB voltage dividers 420, 430.

In various examples, the DAC 400 includes an upper compensating resistor 412 and a lower compensating resistor 414 coupled to the MSB voltage divider 410. The upper compensating resistor 412 is configured to couple to the reference voltage terminal 480 and the MSB voltage divider 410. The lower compensating resistor 414 is configured to couple to the MSB voltage divider 410 and ground terminal 485. When the first set of switches 470 couples the first LSB voltage divider 420 in parallel with a resistor of the MSB voltage divider 410, the resistance of the path between the reference voltage terminal 480 and ground terminal 485 is reduced. The compensating resistors 412, 414 compensate for the reduced resistance when the LSB voltage dividers 420, 430 are coupled in parallel to resistors in the MSB voltage divider 410. For example, the MSB voltage divider 410 includes a set of resistors of value R. In this example, the first LSB voltage divider 420 includes three resistors of value R and the second LSB voltage divider 430 includes another three resistors of value R (different than as depicted in FIG. 4). When the first LSB voltage divider 420 is placed in parallel with a resistor of the MSB voltage divider 410, the parallel resistance is 0.75*R. Similarly, when the second LSB voltage divider 430 is placed in parallel with a different resistor of the MSB voltage divider 410, the parallel resistance is 0.75*R. The resistance is based on the formula for calculating resistors in a parallel circuit:

$$R_{total} = \frac{R_1 * R_2}{R_1 + R_2}.$$

In this example, the upper compensating resistor 412 has a value of 0.25*R and the lower compensating resistor 414 has a value of 0.25*R, which compensates for the parallel configuration of the MSB voltage divider 410 and the LSB voltage divider 420, 430. The compensating resistors 412, 414 are optional, as the resistance value R can be chosen so that the parallel resistance 0.75*R is an acceptable value.

Each of the first and second sets of switches 470, 475 has an uppermost MSB voltage that is achieved by coupling to a node between the MSB voltage divider 410 and the upper compensating resistor 412. Assuming a reference voltage at the reference voltage terminal 480 is a positive reference voltage, the voltage at that node is less than a voltage provided at the reference voltage terminal 480 due to the voltage drop across the upper compensating resistor 412.

Similarly, each of the first and second sets of switches 470, 475 has a lowermost MSB voltage that is achieved by coupling to a node between the MSB voltage divider 410 and the lower compensating resistor 414. Continuing to assume that the reference voltage terminal 480 has a positive reference voltage, the voltage at that node will be greater than a voltage at ground terminal 485 due to the voltage drop across lower compensating resistor 414. Thus, in order to have the ability to provide a DAC output 454, 464 having a voltage equal to that at the ground terminal 485, each of the multiplexors 452, 462 includes an input coupled to the ground terminal 485. Multiplexor 452 receives as its other input a first LSB voltage output from the first LSB voltage divider 420 via the third set of switches 450. For example, the multiplexor 452 provides the input corresponding to the ground terminal 485 as its output if the first digital code (D1) received by the DAC 400 is all 0s; otherwise, the multiplexor 452 provides the first LSB voltage as its output. In an example, the output of the multiplexor 452 is the first DAC output 454. In various examples, additional circuitry is included, such as circuitry for buffering the first DAC output 454 or additional selection logic to select a different voltage as the first DAC output 454. A similar selection logic is applied by multiplexor 462, using a second digital code (D2), which receives the ground connection as one input and receives as its other input the output from the multiplexor 461, which is either the first LSB voltage or a second LSB voltage from the second LSB voltage divider 430.

In an example in which the MSB portions of the digital codes D1 and D2 are the same (e.g., MSB1=MSB2), the DAC 400 does not place both the first LSB voltage divider 420 and the second LSB voltage divider 430 in parallel with the same resistor of the MSB voltage divider 410. Placing both LSB voltage dividers 420, 430 in parallel with the same resistor of the MSB voltage divider 410 would undesirably lower the parallel resistance more than placing just one of the LSB voltage dividers 420, 430 in parallel with the resistor of the MSB voltage divider 410. In this example, the first LSB voltage divider 420 is coupled in parallel with the appropriate resistor of the MSB voltage divider 410, while the second LSB voltage divider 430 is placed in parallel with any other resistor of the MSB voltage divider 410. In an example where MSB1 and MSB2 are the same, the MSB portion of the second digital code D2 is incremented or decremented by suitable circuitry (not shown for simplicity) to select a different configuration of the second set of switches 475 such that the second voltage divider 430 is in parallel with a resistor of the MSB voltage divider 410 other than that specified by the unmodified D2.

In an example, the fourth set of switches 460 selects a LSB output from the second LSB voltage divider 430, while the fifth set of switches 455 selects a LSB output from the first LSB divider 420. The third set of switches 450 and the fifth set of switches 455 can be controlled to select LSB outputs independent of each other.

As explained above, the comparator 456 compares the MSB portion (MSB1) of the first digital code D1 with the MSB portion (MSB2) of the second digital code D2. The two multiplexor 461 inputs are coupled to the fourth set of switches 460 and the fifth set of switches 455, respectively, while an output of the comparator 456 controls the output of the multiplexor 461. When the comparator 456 indicates MSB1 and MSB2 are equal, the multiplexor 461 selects as its output the LSB output from the first LSB voltage divider 420 as selected by the fifth set of switches 455. When the comparator 456 indicates MSB1 and MSB2 are different, the multiplexor 461 selects as its output the LSB output from the second LSB voltage divider 430 as selected by the fourth set of switches 460.

As explained above, the output of multiplexor 461 is one of the inputs to multiplexor 462. The other input of multiplexor 462 is coupled to the ground terminal 485. Based on the second digital code D2, multiplexor 462 selects as its output either the output of multiplexor 461 or the ground terminal 485. In an example, the ground terminal 485 is selected when the bits of D2 are all zeroes, which in some examples is performed by a bitwise logical AND operation of D2. The output of multiplexor 462 is the second DAC output 464.

The MSB portion of D1, MSB1, is also used to control the first set of switches 470. The first set of switches 470 selects a pair of MSB voltages to use as reference voltages for the first LSB divider 420 (e.g., the voltage across a resistor of the MSB voltage divider 410). In this example, the reference voltages are provided to an upper node 422 and a lower node 424 of the first LSB voltage divider 420. The first set of switches 470 is configured such that any particular MSB voltage is able to be coupled to either the upper node 422 or the lower node 424. For example, closing a switch 472 in the first set of switches 470 couples its corresponding MSB voltage to the lower node 424. In this example, that particular MSB voltage output cannot be coupled to the upper node 422. In an example, coupling different pairs of MSB voltage outputs to the first LSB voltage divider 420 results in the upper node 422 being at a higher voltage than the lower node 424; however, in other examples the upper node 422 is at a lower voltage than the lower node 424.

The first digital code (D1) also controls the third set of switches 450 to select one of the LSB voltages from the first LSB voltage divider 420. The voltage applied to the upper node 422 can be higher or lower than the voltage applied to the lower node 424, and thus in an example MSB1, or a portion thereof (e.g., the least significant bit of MSB1), is used in combination with the LSB portion of D1 (LSB1) to control the third set of switches 450.

In an example, the MSB portion of D2, MSB2, controls the second set of switches 475 in a manner similar to that described above with respect to MSB1 controlling the first set of switches 470. LSB2 and the least significant bit of MSB2 are used to control the fourth set of switches 460. The fifth set of switches 455 is also controlled by LSB2. Control of the sets of switches 450, 455, 460 based on the digital codes D1 and D2 is discussed in further detail below.

Figure 5A:
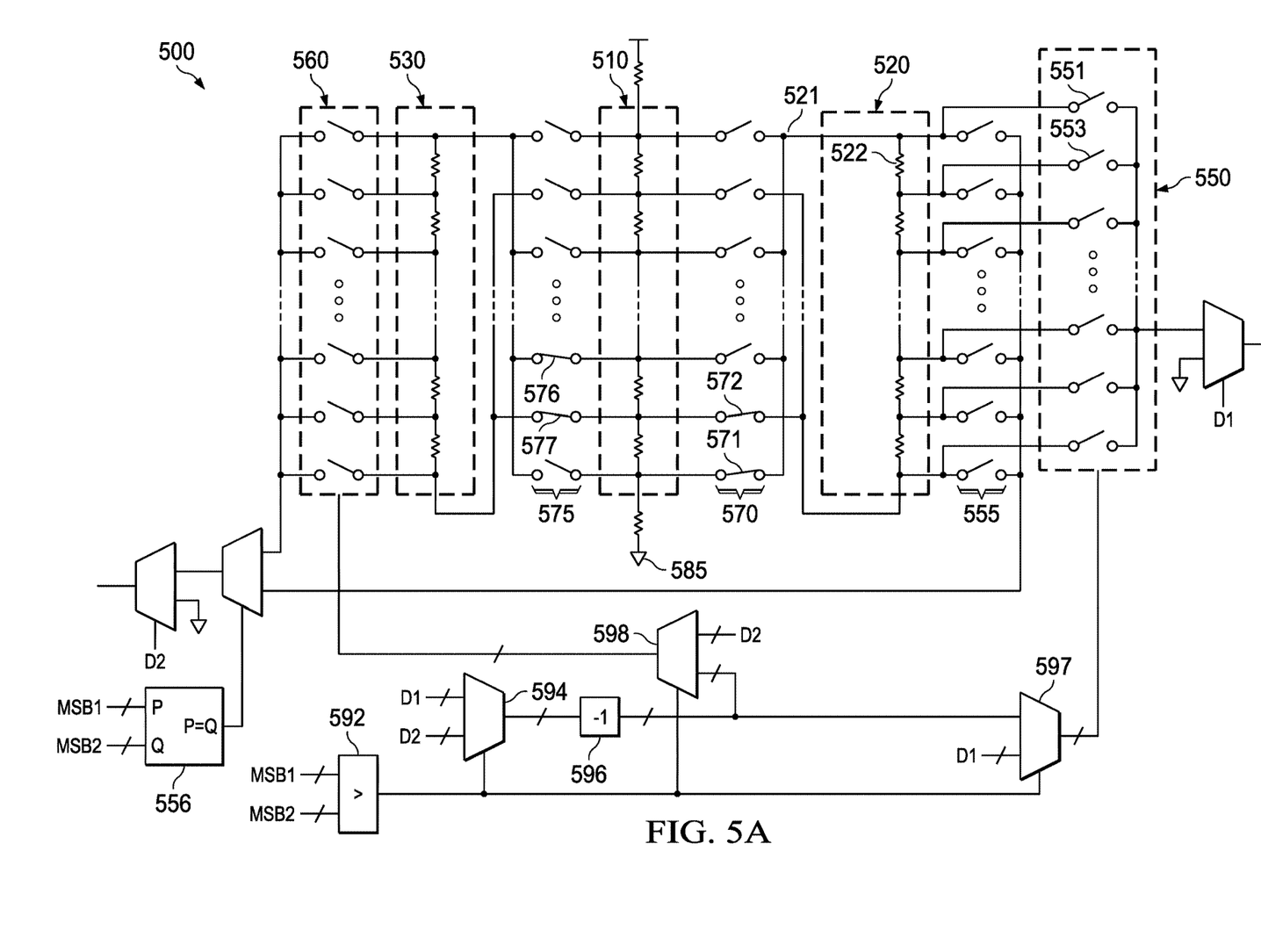
FIG. 5a depicts a schematic diagram of a circuit implementing a DAC that includes a MSB voltage divider, LSB voltage dividers, and a LSB decrementor in accordance with various examples.

FIG. 5a depicts an illustrative circuit implementation of a DAC 500 including a MSB voltage divider 510 and two LSB voltage dividers 520, 530, which are similar to the voltage dividers 410, 420, 430, described above with respect to FIG. 4. As above, by using a single MSB voltage divider 510 to implement a two-output DAC 500, the overall area of the DAC 500 is reduced, even when taking into account the additional control logic, explained further below. The DAC 500 also includes a first set of switches 570, a second set of switches 575, a third set of switches 550, a fourth set of switches 560, and a fifth set of switches 555, which are similar to the switches 470, 475, 450, 455, 460, respectively, described above with respect to FIG. 4.

In some examples, one of the digital codes D1 and D2 input to the DAC 500 is modified (e.g., decremented) prior to being utilized to control the sets of switches 550, 555, 560 coupled to the LSB voltage dividers 520, 530. As explained further below, modifying one of the digital codes D1, D2 results in an analog voltage output of the DAC 500 associated with the modified digital code D1, D2 that is compensated for the voltage drop across the lower compensating resistor (e.g., compensating resistor 414 discussed above), thus providing the expected analog voltage output corresponding to the input digital code. To facilitate modification of one of the digital codes D1 and D2, in addition to the above components, which are similar to those in FIG. 4, the DAC 500 includes a LSB decrementor 596, a comparator 592, and multiplexors 594, 597, and 598 in accordance with various examples. In particular, the multiplexor 594 receives as inputs the digital codes D1 and D2 and generates an output that is decremented by the LSB decrementor 596. The output of the LSB decrementor 596 is provided as an input to the multiplexor 597, which receives D1 as its other input. The output of the LSB decrementor 596 is also provided as an input to the multiplexor 598, which receives D2 as its other input. The comparator 592 compares the MSB portions of digital codes D1 and D2 (e.g., MSB1, MSB2, respectively) and generates an output indicating which of MSB1 and MSB2 is greater. An output of the comparator 592 is applied as a control signal to the multiplexor 594 to select between inputs D1 and D2 to be provided as the output of the multiplexor 594. The output of the comparator 592 is also applied as a control signal to the multiplexor 597 to select between inputs D1 and decremented D1 to be provided as the output of the multiplexor 597. The output of the comparator 592 is further applied as a control signal to the multiplexor 598 to select between inputs D2 and decremented D2 to be provided as the output of the multiplexor 598.

In an example, the DAC 500 receives a first digital code D1 comprising a MSB portion (MSB1) and a LSB portion (LSB1). The DAC 500 also receives a second digital code D2 comprising a MSB portion (MSB2) and a LSB portion (LSB2). In this example, and as explained further below with respect to FIG. 5b, the bits of MSB1 are used (e.g., as a control) to close switches 571, 572. Continuing this example, the bits of MSB2 are used (e.g., as a control) to close switches 576, 577.

Figure 5B:
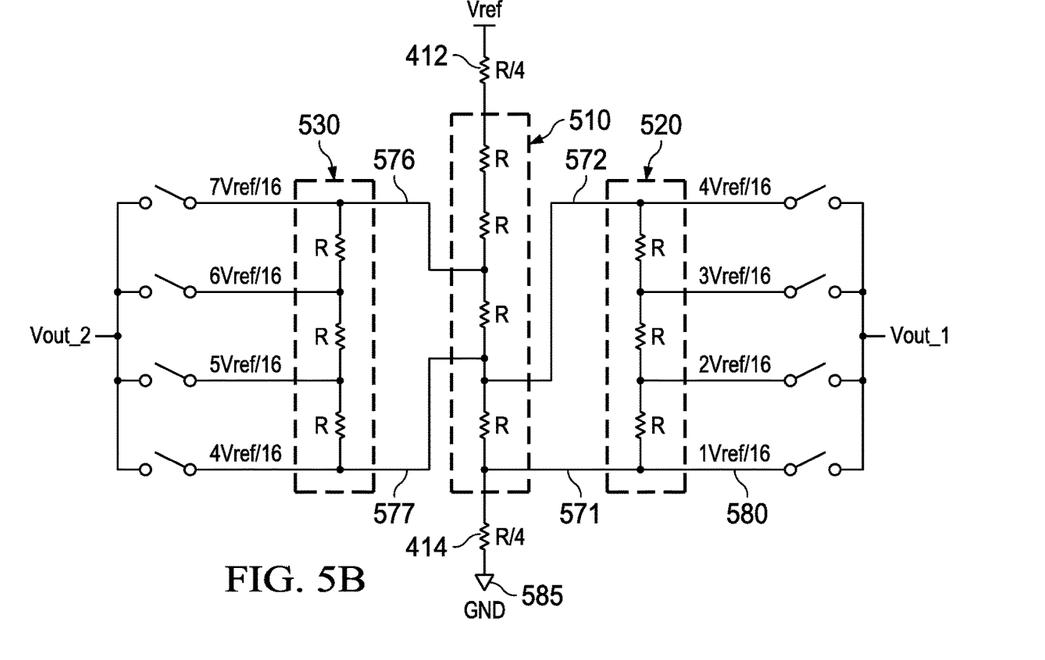
FIG. 5b depicts a schematic diagram of a circuit implementing a DAC in an illustrative configuration in accordance with various examples.

Referring briefly to FIG. 5b, a simplified version of the DAC 500 is shown in order to illustrate certain behavior of the DAC 500, and to further explain the LSB decrementor 596 and use cases for decrementing either D1 or D2. In this example, the DAC 500 is a 4-bit DAC, and thus D1 and D2 are 4-bit digital codes. In this example, MSB1 and MSB2 are 2-bit MSB portions, while LSB1 and LSB2 are 2-bit LSB portions. An MSB portion equal to 00 selects the lowest resistor of the MSB voltage divider 510 (e.g., as illustrated by closing switches 571, 572 surrounding the lowest resistor if MSB1 were 00), an MSB portion equal to 01 selects the second-lowest resistor of the MSB voltage divider 510 (e.g., as illustrated by closing switches 576, 577 surrounding the second lowest resistor if MSB2 were 01), an MSB portion equal to 10 selects the third-lowest resistor of the MSB voltage divider 510, and an MSB portion equal to 11 selects the highest resistor of the MSB voltage divider 510. Similarly, an LSB portion equal to 00 selects (e.g., closes) the lowest switch of the appropriate set of switches coupled to one of the LSB voltage dividers 520, 530; an LSB portion equal to 01 selects the second-lowest switch of the appropriate set of switches coupled to one of the LSB voltage dividers 520, 530; an LSB portion equal to 10 selects the third-lowest switch of the appropriate set of switches coupled to one of the LSB voltage dividers 520, 530; and an LSB portion equal to 11 selects the highest switch of the appropriate set of switches coupled to one of the LSB voltage dividers 520, 530. An analog voltage at the node corresponding to the selected switch of the LSB voltage divider 520, 530 is the analog output corresponding to the input digital code D1, D2, respectively.

As explained above, in some examples, compensating resistors 412, 414 are utilized to compensate for the decrease in total resistance caused by the parallel resistance of the resistors of an LSB voltage divider 520, 530 in parallel with one of the resistors of the MSB voltage divider 510. In this example, the LSB voltage dividers each include three resistors (e.g., allowing for four total outputs, corresponding to LSB portions equal to 00, 01, 10, 11). In this example, the resistors of the LSB voltage dividers 520, 530 and the MSB voltage divider 510 have a resistance value R. As a result, the equivalent resistance of one resistor of the MSB voltage divider 510 in parallel with the resistors of a LSB voltage divider 520, 530 is 3R/4. In this example, the MSB voltage divider 510 should have a total resistance of 4R, and thus the compensating resistors 412, 414 each have a value of R/4.

However, as a result of a voltage across the lower compensating resistor 414, for a given digital code D1, the LSB voltage divider 520 that is coupled to the lower (e.g., closer to the ground terminal 585) resistor of the MSB voltage divider 510 provides an analog voltage output that corresponds to a digital code one greater than D1. For example, the voltages at given nodes in the LSB voltage divider 520 are Vref/16, 2*Vref/16, 3*Vref/16, and 4*Vref/16. The following table demonstrates the discrepancy:

| Input Code (D1) | Output expected (V) | Output without subtraction (V) |
|---|---|---|
| 0000 | 0 | Vref/16 |
| 0001 | Vref/16 | 2 * Vref/16 |
| 0010 | 2 * Vref/16 | 3 * Vref/16 |
| 0011 | 3 * Vref/16 | 4 * Vref/16 |

To address this discrepancy, the digital code having the lower MSB portion (e.g., D1 in the example of FIGS. 5a and 5b) is decremented by one before controlling the various switches. For example, if D1 is 0001 and D2 is 1000, D1 is decremented to 0000 before controlling the MSB voltage divider 510 and the LSB voltage divider 520. As illustrated in FIG. 5b, the voltages at given nodes in the LSB voltage divider 530 are the correct voltages for a given LSB portion, due to the lower compensating resistor 414. The voltages at given nodes in the LSB voltage divider 530 are 4*Vref/16, 5*Vref/16, 6*Vref/16, and 7*Vref/16, and thus the digital code having the greater MSB portion (e.g., D2 in the example of FIGS. 5a and 5b) is not modified prior to controlling the MSB voltage divider 510 and the LSB voltage divider 530.

Referring back to FIG. 5a, due to the parallel resistances of the resistors of each of the two LSB voltage dividers 520, 530 in parallel with different resistors of the MSB voltage divider 510, explained above, the LSB voltage divider 520, 530 that is coupled more closely to a ground terminal 585 modifies the LSB of its digital code before controlling the switches 550, 560, 571, 572, 576, 577. As shown in FIG. 5a, the first LSB voltage divider 520 is coupled to a resistor of the MSB voltage divider 510 that is closer to the ground terminal 585 than the resistor in parallel with the second LSB voltage divider 530. To provide the expected first DAC output voltage value corresponding to the first digital code D1, D1 is decremented. For example, MSB1 being less than MSB2 causes the comparator 592 to generate a control signal that selects D1 as the output of the multiplexor 594, which is then decremented by the LSB decrementor 596. The control signal also selects the decremented D1 as the output of the multiplexor 597. Similarly, the control signal selects D2 (rather than the decremented value) as the output of multiplexor 598. The opposite of the foregoing would occur in the event that MSB2 was less than MSB1. While the decremented D1 is shown controlling the third set of switches 550, in some examples, the decremented D1 also controls the first set of switches 570 coupling the MSB voltage divider 510 to the first LSB voltage divider 520.

For example, assume the first digital code (D1) is 0001, which in this example corresponds to an analog output of the lowest, non-ground voltage value producible by the DAC 500. Switches 571, 572 are closed to provide reference voltages to the first LSB voltage divider 520. In some examples, the lowest voltage available to the first LSB voltage divider 520 (e.g., from the MSB voltage divider 510) is provided to an uppermost node 521 of the LSB voltage divider 520. In this example, the voltage provided to the upper node 521 is the lowest, non-ground voltage output by the DAC 500. However, in this example, MSB1 results in switches 571, 572 being closed, which in turn results in the upper node 521 being a low voltage reference for this particular first digital code. As a result, a LSB code of 01 identifies the second-lowest switch, which in this example is switch 553. However, as explained above, switch 553 actually corresponds to the second lowest, non-ground value, or the third-lowest representable value (e.g., due to a voltage rise from the upper node 521 across resistor 522). In other words, although the LSB code of 01 is associated with switch 553, switch 551 actually corresponds to the desired lowest, non-ground value that should be associated with the digital code 0001.

As explained above, the decrementor 596 is used to account for the above-described offset in the LSB value for the LSB voltage divider 520, 530 coupled to the lower resistor in the MSB voltage divider 510 (e.g., the resistor closest to the ground terminal 585). Comparator 592 determines whether the MSB of the first or second digital code is higher. In some examples, the comparator 592 shares circuitry with the comparator 556, which determines whether the MSBs are equal. An output of the comparator 592 is applied as a control signal to a multiplexor 594 to select between inputs D1 and D2 to be provided as the output of the multiplexor 594. The output of multiplexor 594 is coupled to decrementor 596, which subtracts one from the selected digital code value. The output of the comparator 592 is also applied as a control signal to a multiplexor 597 to select between inputs D1 and decremented D1 to be provided as the output of the multiplexor 597 to control the third set of switches 550. The output of the comparator 592 is further applied as a control signal to a multiplexor 598 to select between inputs D2 and decremented D2 to be provided as the output of the multiplexor 598 to control the fourth set of switches 560.

Figure 6:
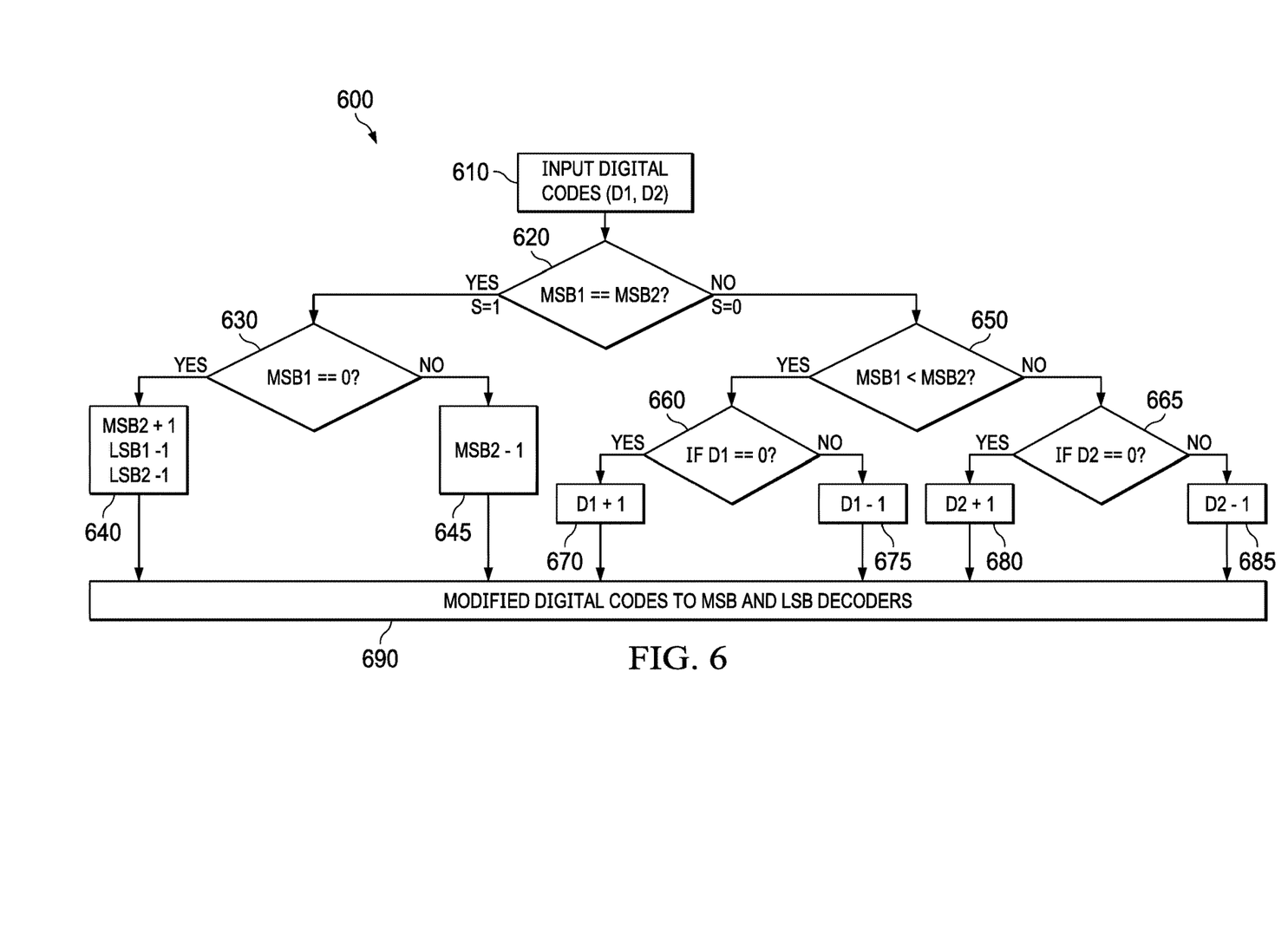
FIG. 6 depicts a flow diagram of a method of modifying DAC digital codes in accordance with various examples.

FIG. 6 shows a flow diagram of a method 600 of modifying DAC digital codes in accordance with various examples. This method 600 shows an example of how digital codes D1 and D2 control the functionality of the multiplexors described above with respect to FIGS. 4 and 5a to implement a two-output DAC, for example the DACs 400, 500 described above.

The method 600 begins with receiving two digital codes (D1 and D2) as input (block 610). D1 includes a MSB portion MSB1 and a LSB portion LSB1. D2 includes a MSB portion MSB2 and a LSB portion LSB2. The method 600 continues with comparing MSB1 and MSB2 for equality (block 620).

In an example, if MSB1 and MSB2 are not equal, the selector (S) is set to 0. The selector (S) controls a multiplexor (e.g., multiplexor 461 in FIG. 4) to select an output of a second LSB voltage divider instead of a first LSB voltage divider. The method 600 continues with determining whether MSB1 or MSB2 is greater (block 650). If MSB2 is greater, the method 600 continues with comparing D1 to zero (block 660). If D1 is zero, the first digital code is identified as corresponding to a voltage value at a ground terminal (e.g., in an example where a digital code of zero corresponds to a lowest voltage, that voltage being a voltage at a ground terminal). If D1 is zero, the method 600 continues with incrementing the value of D1 (block 670). In some examples, where the original D1 is zero, control logic uses the original D1 as a control signal for the multiplexor 452 to select a ground terminal voltage value as its output. If D1 is not zero, the method 600 continues with decrementing D1 (block 675). Decrementing D1 is performed in situations where the first LSB voltage divider is coupled to the MSB voltage divider closer to a ground terminal than the second LSB voltage divider, as explained above with respect to FIGS. 5a and 5b. If MSB1 is greater, the method 600 continues with comparing D2 to zero (block 665). If D2 is zero, the method 600 continues with incrementing D2 (block 680). As above, in some examples where the original D2 is zero, control logic uses the original D2 as a control signal for the multiplexor 462 to select a ground terminal voltage value as its output. If D2 is not zero, the method 600 continues with decrementing D2 (block 685). Decrementing D2 is performed in situations where the second LSB voltage divider is coupled to the MSB voltage divider closer to a ground terminal than the first LSB voltage divider, as explained above with respect to FIG. 5a.

In block 620, if the MSBs are equal, the selector (S) is set to 1. The selector (S) controls a multiplexor (e.g., multiplexor 461 in FIG. 4) to select an output of the first LSB voltage divider to be used instead of the second LSB voltage divider. The method 600 continues with determining whether MSB1 is zero (block 630). If MSB1 is not zero, the method 600 continues with decrementing MSB2 (block 645). The second LSB voltage divider is thus coupled to the MSB voltage divider closer to a ground terminal than the first LSB voltage divider, and neither D1 nor D2 is decremented. If MSB1 is zero, the method 600 continues with incrementing MSB2, decrementing LSB1, and decrementing LSB2 (block 640). This moves the coupling of the second LSB voltage divider to a different resistor of the MSB voltage divider, so both LSB voltage dividers are not coupled to the same resistor of the MSB voltage divider. The resistors of the first LSB voltage divider remain coupled in parallel with the resistor of the MSB voltage divider closest to the ground terminal, and thus LSB1 and LSB2 are decremented as explained above with respect to FIG. 5a. Regardless of whether D1 and/or D2 are modified according to blocks 640, 645, 670, 675, 680, or 685, in block 690 the resultant modified digital codes D1 and D2 are provided to decoders to control the sets of switches coupled to the MSB voltage divider (e.g., MSB divider 510) and the sets of switches coupled to the LSB voltage dividers (e.g., LSB voltage dividers 520, 530) as described above.

Figure 7:
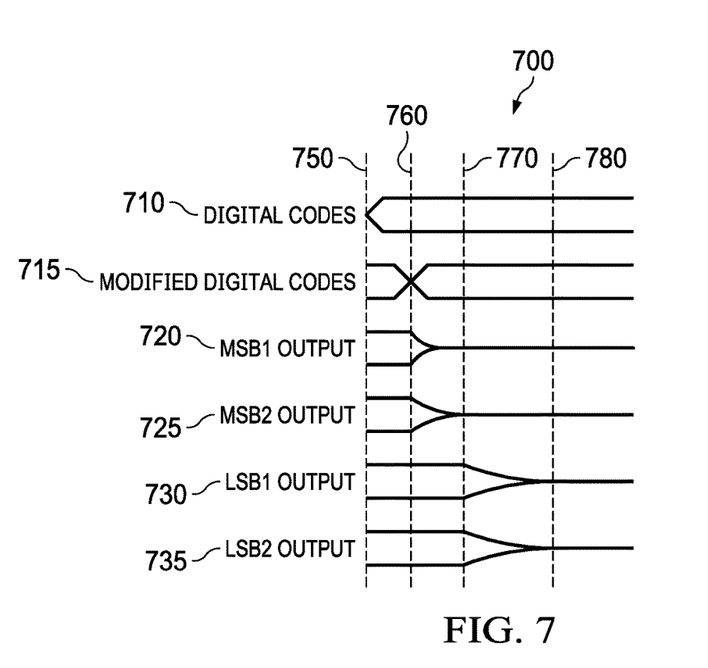
FIG. 7 depicts a timing diagram for a two-output DAC in accordance with various examples.

FIG. 7 shows a timing diagram 700 for a two-output DAC (e.g., the DAC 500 of FIG. 5a) in accordance with various examples. At a first point in time 750, the digital codes 710 have stabilized as inputs. For example, the digital codes 710 transition to new values at different times, and thus at time 750, the digital bits of the digital codes 710 have reached their respective states after transition, or stabilized. The digital codes 710 include a first digital code and a second digital code. The first digital code and second digital code are multi-bit digital signals corresponding to analog output voltages to be produced by the DAC. Modifications of the digital codes 710 begin at the first point in time 750 to create the modified digital codes 715. For example, the modification of the digital codes 710 is according to a method such as the method described in FIG. 6. The modified digital codes 715 have stabilized by a second point in time 760, based on the logic used to modify the digital codes 710. In an example, the logic includes digital logic such as NAND and NOR gates or an analog control system. The MSB1 output 720 is the output of the MSB voltage divider to the first LSB voltage divider. The MSB2 output 725 is the output of the MSB voltage divider to the second LSB voltage divider. MSB1 output 720 and MSB2 output 725 begin changing to the selected values after the modified digital codes 715 have stabilized at the second point in time 760. In certain examples, MSB1 output 720 and MSB2 output 725 stabilize at different points in time. Regardless of when and in which order the MSB1 and MSB2 outputs 720, 725 stabilize, both are stable analog values by a third point in time 770. LSB1 output 730 is the first DAC output, after any multiplexing with a ground terminal. LSB2 output 735 is the second DAC output, after any multiplexing with a ground terminal or other signals. In certain examples, LSB1 output 730 and LSB2 output 735 stabilize at different points in time. Regardless of when and in which order the LSB1 and LSB2 outputs 730, 735 stabilize, both are stable by a fourth point in time 780. In some examples, the LSB1 output 730 or LSB2 output 735 stabilize before the third point in time 770. For example, if the first digital code corresponds to an output of a ground terminal voltage value, the LSB1 output 730 stabilizes at the ground terminal voltage value before the third point in time 770, as a multiplexor couples LSB1 output 730 to the ground terminal without regard to how quickly the MSB1 output 720 stabilizes.

In certain examples, the DAC toggles a ready flag or output to indicate the LSB1 output 730 and LSB2 output 735 are stable. In some examples, the flag is based on a timer, regardless of the actual stabilization of the LSB1 output 730 and LSB2 output 735. For example, the timer is based on a calculated worst-case scenario for calculation of the modified digital codes 715 and stabilization of the MSB1 output 720, MSB2 output 725, LSB1 output 730, and LSB2 output 735.

In various examples, the voltage outputs of the MSB voltage divider are specified to a higher accuracy than the LSB voltage dividers. For example, a 1% variation in the output of the MSB voltage divider causes a higher inaccuracy than a 1% variation in the output of one of the LSB voltage dividers, as the MSB voltage divider spans a larger voltage range. When the MSB voltage divider and LSB voltage divider are implemented on silicon, an area used for one resistor of the MSB voltage divider is larger than an area used for a resistor of comparable resistance in the LSB voltage divider to achieve a comparable accuracy. Thus, by using one MSB voltage divider to create a two-output DAC (e.g., rather than using two MSB voltage dividers, one for each DAC output), space savings is achieved. In an example, the space savings is greater than the additional space occupied by the digital control explained above to allow multiple LSB voltage dividers to use the same MSB voltage divider.

In the foregoing discussion, the terms "including and comprising" are used in an open-ended fashion, and thus should be interpreted to mean "including, but not limited to . . . ." The term "couple" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially after the functional relationship between device A and device B such that device B is controlled by device A via the control signal generated by device A. A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof. Furthermore, a circuit or device that is said to include certain components may instead be configured to couple to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be configured to couple to at least some of the passive elements and/or the sources to form the described structure either at a time of manufacture or after a time of manufacture, for example, by an end-user and/or a third-party.

While certain components are described herein as being of a particular process technology (e.g., FET, MOSFET, n-type, p-type, etc.), these components may be exchanged for components of other process technologies (e.g., replace FET and/or MOSFET with bi-polar junction transistor (BJT), replace n-type with p-type or vice versa, etc.) and reconfiguring circuits including the replaced components to provide desired functionality at least partially similar to functionality available prior to the component replacement. Components illustrated as resistors, unless otherwise stated, are generally representative of any one or more elements coupled in series and/or parallel to provide an amount of impedance represented by the illustrated resistor. Additionally, uses of the phrase "ground voltage potential" in the foregoing discussion are intended to include a chassis ground, an Earth ground, a floating ground, a virtual ground, a digital ground, a common ground, and/or any other form of ground connection applicable to, or suitable for, the teachings of the present disclosure. Unless otherwise stated, "about," "approximately," or "substantially" preceding a value means +/−10 percent of the stated value.

The above discussion is meant to be illustrative of the principles and various examples of the present disclosure. Numerous variations and modifications will become apparent to those skilled in the art once the above disclosure is fully appreciated. It is intended that the present disclosure be interpreted to embrace all such variations and modifications.

What is claimed is:

1. A circuit, comprising:
a first voltage divider having a set of most significant bit (MSB) outputs each representative of a value of a MSB portion of a digital code;
a second voltage divider comprising:
a first upper voltage input configured to couple to a first one of a first pair of outputs of the set of MSB outputs; and
a first lower voltage input configured to couple to a second one of the first pair of outputs of the set of MSB outputs; and
a third voltage divider comprising:
a second upper voltage input configured to couple to a first one of a second pair of outputs of the set of MSB outputs; and
a second lower voltage input configured to couple to a second one of the second pair of outputs of the set of MSB outputs.

2. The circuit of claim 1, further comprising:
a reference voltage terminal;
a ground terminal;
a first resistor coupled to the reference voltage terminal and an uppermost resistor of the first voltage divider; and
a second resistor coupled to the ground terminal and a lowermost resistor of the first voltage divider.

3. The circuit of claim 1, further comprising:
a first set of switches coupled to a first set of least significant bit (LSB) outputs of the second voltage divider;
a second set of switches coupled to a second set of LSB outputs of the third voltage divider; and
a first multiplexor coupled to the first set of switches and the second set of switches.

4. The circuit of claim 3, further comprising:
a second multiplexor coupled to an output of the first multiplexor and to a ground terminal; and
a third multiplexor coupled to the first set of switches and to the ground terminal.

5. The circuit of claim 1, further comprising:
a first digital MSB input;
a first digital LSB input;
a second digital MSB input;
a second digital LSB input;
a first analog output;
a second analog output;
a comparator coupled to the first digital MSB input and the second digital MSB input;
a first multiplexor coupled to the first digital LSB input, the second digital LSB input, and an output of the comparator; and
a decrementor coupled to an output of the first multiplexor.

6. The circuit of claim 5, further comprising:
a first set of switches coupled to the set of MSB outputs, to the first LSB voltage divider, and to the first digital MSB input;
a second set of switches coupled to the set of MSB outputs, to the second LSB voltage divider, and to the second digital MSB input;
a third set of switches coupled to the second voltage divider;
a fourth set of switches coupled to the third voltage divider;
a second multiplexor coupled to the decrementor, to the second digital LSB input, to the comparator, and to the fourth set of switches;
a third multiplexor coupled to the decrementor, to the first digital LSB input, to the comparator, and to the third set of switches;
a fifth set of switches coupled to the second voltage divider;
a fourth multiplexor coupled to the fourth set of switches, to the fifth set of switches, and to the comparator; and
a fifth multiplexor coupled to the third set of switches, to a ground terminal, and to the third multiplexor.

7. A circuit, comprising:
a first voltage divider configured to generate a set of most significant bit (MSB) voltages each corresponding to a value of a MSB portion of a digital code;
a second voltage divider configured to divide a first pair of MSB voltages from the set of MSB voltages into a first set of least significant bit (LSB) voltages; and
a third voltage divider configured to divide a second pair of MSB voltages from the set of MSB voltages into a second set of LSB voltages.

8. The circuit of claim 7, further comprising:
a first voltage source configured to provide a first voltage value;
a second voltage source configured to provide a second voltage value;
a first resistor coupled to the first voltage source and the first voltage divider, wherein a resistance of the first resistor is based on a first resistance value when the second voltage divider is coupled in parallel with a resistor of the first voltage divider; and
a second resistor coupled to the first voltage divider and the second voltage source, wherein a resistance of the second resistor is based on a second resistance value when the second voltage divider is coupled in parallel with the resistor of the first voltage divider.

9. The circuit of claim 7, further comprising:
a first set of switches configured to:
receive the first set of LSB voltages; and
select a first LSB voltage from the first set of LSB voltages;
a second set of switches configured to:
receive the second set of LSB voltages; and
select a second LSB voltage from the second set of LSB voltages; and
a first multiplexor coupled to the first set of switches and the second set of switches, the first multiplexor configured to select one of the first LSB voltage and the second LSB voltage as an output of the first multiplexor, wherein a first analog voltage output receives the first LSB voltage and a second analog voltage output receives the output of the first multiplexor.

10. The circuit of claim 9, further comprising:
a second multiplexor coupled to an output of the first multiplexor and to a ground terminal, the second multiplexor configured to select one of the output of the first multiplexor and a voltage at the ground terminal as an output of the second multiplexor; and
a third multiplexor coupled to the first set of switches and to the ground terminal, the third multiplexor configured to select one of the first LSB voltage and the voltage at the ground terminal as an output of the third multiplexor.

11. The circuit of claim 7, further comprising:
a first digital MSB input configured to receive a MSB portion of a first digital code;

a first digital LSB input configured to receive a LSB portion of the first digital code;
a second digital MSB input configured to receive a MSB portion of a second digital code;
a second digital LSB input configured to receive a LSB portion of the second digital code;
a first analog output coupled to the second voltage divider, the first analog output configured to output a first voltage value corresponding to the first digital code;
a second analog output coupled to the second voltage divider, the second analog output configured to output a second voltage value corresponding to the second digital code;
a comparator coupled to the first digital MSB input and the second digital MSB input, the comparator configured to determine whether the MSB portion of the first digital code is greater than the MSB portion of the second digital code;
a first multiplexor coupled to the first digital LSB input, the second digital LSB input, and an output of the comparator, the first multiplexor configured to select one of the first digital LSB input and the second digital LSB input as an output of the first multiplexor based on a determination of the comparator; and
a decrementor coupled to the first multiplexor, the decrementor configured to decrement the LSB portion of the first digital code or the second digital code based on a selection between the first digital LSB input and the second digital LSB input.

12. The circuit of claim 11, further comprising:
a first set of switches coupled to the first voltage divider, to the second voltage divider, and to the first digital MSB input, wherein the first set of switches is configured to:
  select the first pair of MSB voltages from the set of MSB voltages based on the first digital MSB input; and
  couple the first pair of MSB voltages to the second voltage divider;
a second set of switches coupled to the first voltage divider, to the third voltage divider, and to the second digital MSB input, wherein the second set of switches is configured to
  select the second pair of MSB voltages from the set of MSB voltages based on the second digital MSB input; and
  couple the second pair of MSB voltages to the third voltage divider;
a third set of switches coupled to the second voltage divider, the third set of switches configured to select a first LSB output voltage;
a fourth set of switches coupled to the third voltage divider, the fourth set of switches configured to select a second LSB output voltage;
a second multiplexor coupled to the decrementor, to the second digital LSB input, to the comparator, and to the fourth set of switches, wherein the fourth set of switches is configured to select the second LSB output voltage based on an output of the second multiplexor;
a third multiplexor coupled to the decrementor, to the first digital LSB input, to the comparator, and to the third set of switches, wherein the third set of switches is configured to select the first LSB output voltage based on an output of the third multiplexor;
a fifth set of switches coupled to the second voltage divider, the fifth set of switches configured to provide a third LSB output voltage as a result of the MSB portion of the first digital code being equal to the MSB portion of the second digital code;
a fourth multiplexor coupled to the fourth set of switches, to the fifth set of switches, and to the comparator, the fourth multiplexor configured to select one of the second LSB output voltage and the third LSB output voltage as an output of the fourth multiplexor; and
a fifth multiplexor coupled to the third set of switches, to a ground terminal, and to the third multiplexor, the fifth multiplexor configured to select one of the first LSB output voltage and a voltage at the ground terminal as an output of the fifth multiplexor.

13. The circuit of claim 7, further comprising:
a first digital input configured to select the first pair of MSB voltages from the set of MSB voltages and to select a first analog output voltage from the first set of LSB voltages; and
a second digital input configured to select the second pair of MSB voltages from the set of MSB voltages and to select a second analog output voltage from the second set of LSB voltages.

14. A system, comprising:
an upper voltage reference input;
a lower voltage reference input;
a set of most significant bit (MSB) resistors coupled to the upper voltage reference input and the lower voltage reference input, the set of MSB resistors configured to provide a set of MSB voltage outputs based on the upper voltage reference input and the lower voltage reference input;
a first pair of switches;
a first set of least significant bit (LSB) resistors, the first pair of switches configured to couple a first pair of MSB voltage outputs from the set of MSB voltage outputs to the first set of LSB resistors, the first set of LSB resistors configured to provide a first set of LSB voltages based on the first pair of MSB voltages;
a second pair of switches; and
a second set of least significant bit (LSB) resistors, the second pair of switches configured to couple a second pair of MSB voltage outputs from the set of MSB voltage outputs to the second set of LSB resistors, the second set of LSB resistors configured to provide a second set of LSB voltages based on the second pair of MSB voltages.

15. The system of claim 14, further comprising:
a first resistor coupled to the upper voltage reference input and the set of MSB resistors; and
a second resistor coupled to the set of MSB resistors and the lower voltage reference input.

16. The system of claim 14, further comprising:
a first set of switches configured to:
  receive the first set of LSB voltages; and
  select a first LSB voltage from the first set of LSB voltages;
a second set of switches configured to:
  receive the second set of LSB voltages; and
  select a second LSB voltage from the second set of LSB voltages; and
a first multiplexor coupled to the first set of switches and the second set of switches, the first multiplexor configured to select one of the first LSB voltage and the second LSB voltage as an output of the first multiplexor, wherein a first analog voltage output receives the first LSB voltage and a second analog voltage output receives the output of the first multiplexor.

17. The system of claim 16, further comprising:
a second multiplexor coupled to an output of the first multiplexor and to a ground terminal, the second multiplexor configured to select one of the output of the first multiplexor and a voltage at the ground terminal as an output of the second multiplexor; and
a third multiplexor coupled to the first set of switches and to the ground terminal, the third multiplexor configured to select one of the first LSB voltage and the voltage at the ground terminal as an output of the third multiplexor.

18. The system of claim 14, further comprising:
a first digital MSB input configured to receive a MSB portion of a first digital code;
a first digital LSB input configured to receive a LSB portion of the first digital code;
a second digital MSB input configured to receive a MSB portion of a second digital code;
a second digital LSB input configured to receive a LSB portion of the second digital code;
a first analog output coupled to the first set of LSB resistors, the first analog output configured to output a first voltage value corresponding to the first digital code;
a second analog output coupled to the second set of LSB resistors, the second analog output configured to output a second voltage value corresponding to the second digital code;
a comparator coupled to the first digital MSB input and the second digital MSB input, the comparator configured to determine whether the MSB portion of the first digital code is greater than the MSB portion of the second digital code;
a first multiplexor coupled to the first digital LSB input, the second digital LSB input, and an output of the comparator, the first multiplexor configured to select one of the first digital LSB input and the second digital LSB input as an output of the first multiplexor based on a determination of the comparator; and
a decrementor coupled to the first multiplexor, the decrementor configured to decrement the LSB portion of the first digital code or the second digital code based on a selection between the first digital LSB input and the second digital LSB input.

19. The system of claim 18, further comprising:
a first set of switches coupled to the set of MSB resistors, to the first set of LSB resistors, and to the first digital MSB input, the first set of switches comprising the first pair of switches, wherein the first set of switches is configured to select the first pair of MSB voltage outputs from the set of MSB voltage outputs based on the first digital MSB input and via the first pair of switches;
a second set of switches coupled to the set of MSB resistors, to the second set of LSB resistors, and to the second digital MSB input, the second set of switches comprising the second pair of switches, wherein the second set of switches is configured to select the second pair of MSB voltages from the set of MSB voltages based on the second digital MSB input and via the second pair of switches;
a third set of switches coupled to the first set of LSB resistors, the third set of switches configured to select a first LSB output voltage from the first set of LSB voltages;
a fourth set of switches coupled to the second set of LSB resistors, the fourth set of switches configured to select a second LSB output voltage from the second set of LSB voltages;
a second multiplexor coupled to the decrementor, to the second digital LSB input, to the comparator, and to the fourth set of switches, wherein the fourth set of switches is configured to select the second LSB output voltage based on an output of the second multiplexor;
a third multiplexor coupled to the decrementor, to the first digital LSB input, to the comparator, and to the third set of switches, wherein the third set of switches is configured to select the first LSB output voltage based on an output of the third multiplexor;
a fifth set of switches coupled to the first set of LSB resistors, the fifth set of switches configured to provide a third LSB output voltage as a result of the MSB portion of the first digital code being equal to the MSB portion of the second digital code;
a fourth multiplexor coupled to the fourth set of switches, to the fifth set of switches, and to the comparator, the fourth multiplexor configured to select one of the second LSB output voltage and the third LSB output voltage as an output of the fourth multiplexor; and
a fifth multiplexor coupled to the third set of switches, to a ground terminal, and to the third multiplexor, the fifth multiplexor configured to select one of the first LSB output voltage and a voltage at the ground terminal as an output of the fifth multiplexor.

20. The system of claim 14, further comprising:
a first multiplexor coupled to:
the first set of LSB resistors and configured to receive the first set of LSB voltages; and
a ground terminal, wherein the first multiplexor is configured to select a first output voltage from the first set of LSB voltages and a voltage at the ground terminal; and
a second multiplexor coupled to:
the first set of LSB resistors and configured to receive the first set of LSB voltages;
the second set of LSB resistors and configured to receive the second set of LSB voltages; and
the ground terminal, wherein the second multiplexor selects a second output voltage from the first set of LSB voltages, the second set of LSB voltages, and the voltage at the ground terminal.

* * * * *